(12) United States Patent
Rowser et al.

(10) Patent No.: US 7,936,311 B2
(45) Date of Patent: May 3, 2011

(54) DIRECTIVE, BROADBAND, HIGH GAIN, ACTIVE ANTENNA SYSTEM

(75) Inventors: Andrew Rowser, Kent, WA (US); Christopher D. Long, Maple Valley, WA (US); Glenn Borland, Escondido, CA (US); W. Leo Hoarty, Morgan Hill, CA (US)

(73) Assignee: Omereen Wireless, LLC, Dover, DE (US)

( * ) Notice: Subject to any disclaimer, the term of this patent is extended or adjusted under 35 U.S.C. 154(b) by 391 days.

(21) Appl. No.: 10/590,604

(22) PCT Filed: Nov. 21, 2005

(86) PCT No.: PCT/US2005/041981
§ 371 (c)(1),
(2), (4) Date: Aug. 24, 2006

(87) PCT Pub. No.: WO2006/078347
PCT Pub. Date: Jul. 27, 2006

(65) Prior Publication Data
US 2007/0152902 A1 Jul. 5, 2007

Related U.S. Application Data

(60) Provisional application No. 60/629,688, filed on Nov. 19, 2004.

(51) Int. Cl.
*H01Q 9/28* (2006.01)
(52) U.S. Cl. .................. 343/795; 343/711; 343/908
(58) Field of Classification Search .............. 343/744, 343/748, 702, 741, 795, 908, 700 MS, 711–713, 343/845–846
See application file for complete search history.

(56) References Cited

U.S. PATENT DOCUMENTS

| | | | | |
|---|---|---|---|---|
| 3,925,774 A | | 12/1975 | Amlung | |
| 4,607,394 A | * | 8/1986 | Nightingale | 455/327 |
| 5,050,236 A | * | 9/1991 | Colman et al. | 455/193.1 |
| 5,111,213 A | * | 5/1992 | Jahoda et al. | 343/722 |
| 5,266,963 A | * | 11/1993 | Carter | 343/850 |
| 5,995,814 A | * | 11/1999 | Yeh | 455/180.1 |
| 6,016,108 A | * | 1/2000 | Terk et al. | 340/825.72 |
| 6,239,747 B1 | * | 5/2001 | Kaminski | 342/442 |
| 6,525,691 B2 | * | 2/2003 | Varadan et al. | 343/700 MS |
| 6,917,336 B2 | * | 7/2005 | Rowser et al. | 343/701 |
| 7,027,005 B1 | * | 4/2006 | Chien | 343/795 |
| 7,236,129 B2 | * | 6/2007 | Nilsson | 343/700 MS |
| 7,292,827 B2 | * | 11/2007 | McCorkle | 455/78 |
| 7,295,254 B2 | * | 11/2007 | Bendov | 348/836 |
| 2006/0033584 A1 | * | 2/2006 | Fujimoto et al. | 331/36 L |
| 2006/0132360 A1 | * | 6/2006 | Caimi et al. | 343/700 MS |

* cited by examiner

*Primary Examiner* — Douglas W Owens
*Assistant Examiner* — Chuc D Tran
(74) *Attorney, Agent, or Firm* — Perkins Coie LLP

(57) ABSTRACT

A broadband, high-gain, active antenna system is disclosed, which operates with a bi-directive reception pattern while in its standard configuration and with a directive reception pattern over several octaves of Radio Frequency (RF) spectrum when affixed with a tuned scatter-plate. As a standalone active antenna system the disclosed antenna probe element and the amplifier subassembly exhibit the bi-directional directive properties of a standard fixed length dipole, while the addition of a scatter-plate makes the antenna directive with separate frequency-dependant directive modes. The scatter-plate can be tuned such that these separate directive modes occur at convenient areas of the RF frequency spectrum. Other means of achieving directivity are disclosed using the antenna probe element and the amplifier subassembly.

17 Claims, 2 Drawing Sheets

US 7,936,311 B2

DIRECTIVE, BROADBAND, HIGH GAIN, ACTIVE ANTENNA SYSTEM

CROSS-REFERENCE TO RELATED APPLICATION(S)

This application claims the benefit of U.S. Provisional Patent Application No. 60/629,688, filed on Nov. 19, 2004.

TECHNICAL FIELD

The disclosed embodiments, in general, relate to antenna systems and, in particular, to a broadband high-gain active antenna system.

BACKGROUND

Most antenna developments up to this point have focused on traditional passive power transduction mechanisms, which rely on matching the radiation resistance of the antenna structure to the intrinsic impedance of free space and matching the output terminal impedance of the antenna structure to the input impedance of the receive system. There are numerous passive matching techniques and geometries that have been developed over the many years antenna technology has been in existence. Most of the innovation in antenna technology has been in the Aerospace, Defense, and Satellite Communications industries, while Commercial Radio and Television have long relied upon technology that has been available for over 40 years.

The current Television (TV) spectrum extends from 54 MHz to 806 MHz, corresponding to wavelengths ranging from 5.6 meters to 37 centimeters respectively. The more efficient, passive TV antenna designs commonly used can be relatively large and involve fairly elaborate geometries, to accommodate this range of frequencies. Typical TV antenna designs range from simple narrowband dipole structures, designed to be ½ of a wavelength at the frequency of interest, to more exotic broadband structures such as the log periodic dipole array, which consists of several dipoles of decreasing size arranged coaxially. An efficient log periodic array can exceed 3 meters in length, with the longest dipole element reaching up to 2.7 meters. An array of this size can achieve gains as high as 5 dB to 9 dB over that of a dipole, which typically is around 2 dBI at a resonant ½ wavelength. This advantage over the dipole is a result of directive gain associated with the particular combination and relative phasing of the array elements. The single dipole has a bi-directional radiation/reception pattern and a bandwidth of around 30%, whereas the log periodic array is designed for a highly directional radiation/reception pattern and can accommodate bandwidths of several octaves.

Electrically small antennas are becoming more common in recent years due to size constraints imposed on many wireless consumer electronics. Also, there is a growing interest in this technology within the TV broadcast community as applied to indoor analog and digital TV reception and the indoor reception of Datacasting services. For example, a consumer residing in an apartment may require a high-gain directive antenna to receive broadcast DTV and/or an on-demand movie service via Datacasting, but does not have the space to utilize a typical log-periodic array. In this case, only an electrically small, broadband, high-gain antenna, with some directive selectivity for interference rejection, would be practical.

There are indoor antennas available to the consumer designed with these applications in mind, but most perform at low efficiencies and utilize active electronics to amplify the low-level antenna output power. Antennas such as these are often referred to as "active antennas" or "integrated active antennas", even though they are simply passive antennas with low-noise amplifiers (LNA) conditioning the output signal. The antenna section of these assemblies are acting as power transducers and still must be impedance matched to the LNA at all frequencies of interest to be useful. As a result, the indoor TV antenna designer must utilize broadband design techniques to achieve a broadband impedance match between the antenna output and the LNA input over several octaves of the TV frequency spectrum. If the additional requirement of directivity/spatial selectivity is imposed, the design becomes much more challenging.

DETAILED DESCRIPTION

Illustrative embodiments of active antenna systems and methods are described below. The following explanation provides specific details for a thorough understanding of and enabling description for these embodiments. One skilled in the art will understand that the invention may be practiced without such details. In other instances, well-known structures and functions have not been shown or described in detail to avoid unnecessarily obscuring the description of the embodiments.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section. Accordingly, the actual scope of the invention encompasses not only the disclosed embodiments, but also all equivalent ways of practicing or implementing the invention under the claims.

Figure 1:
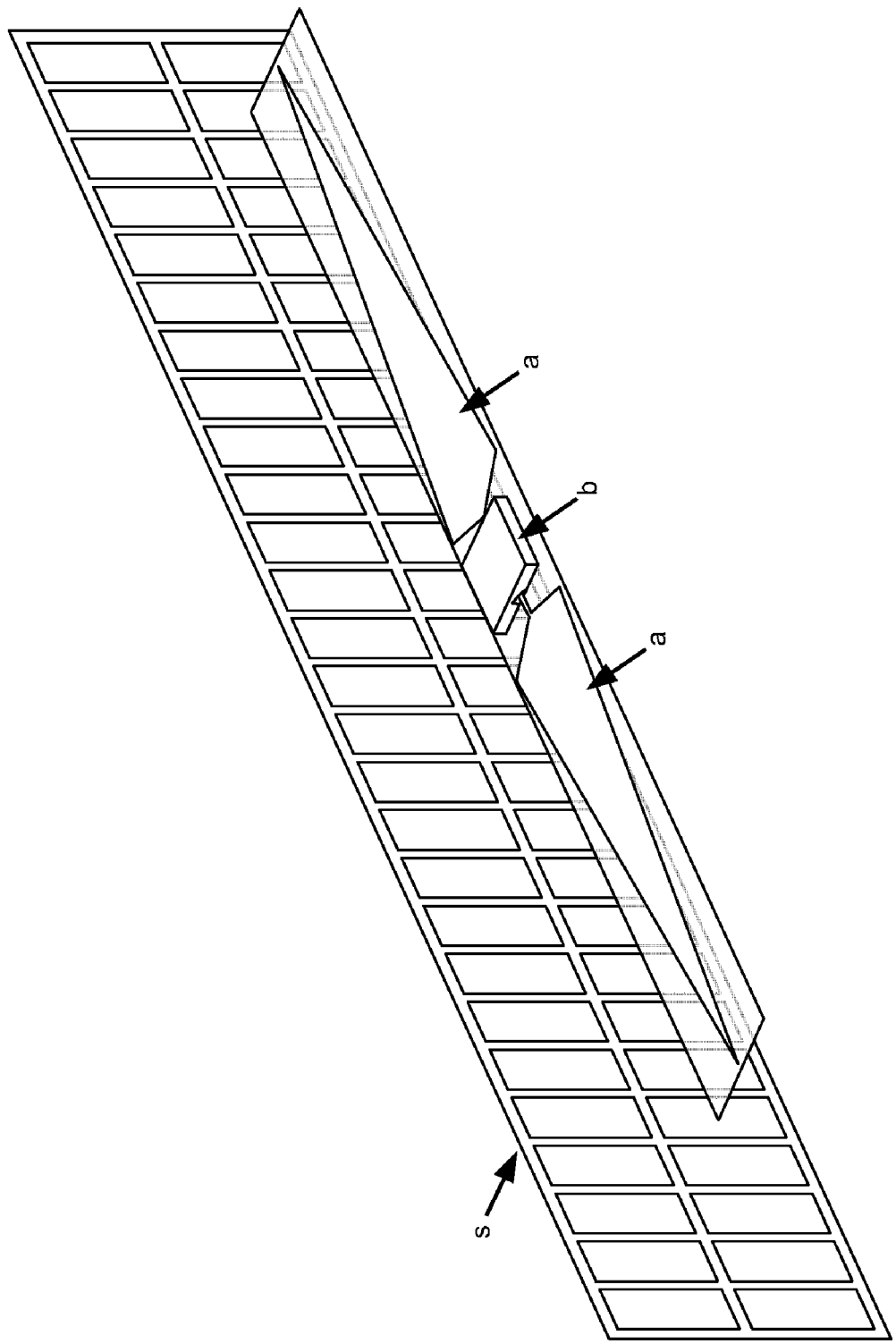
FIG. 1 illustrates an embodiment of the invention where an antenna system is in a directive configuration.

FIG. 1 depicts a high gain, broadband, directive active antenna system. This active antenna system consists of a pair of dipole probe elements (a) connected to a highly linear, balanced amplifier with large input impedance (b), and a tuned scatter-plate assembly (s).

This antenna system employs an electric field (E-field) sensor active antenna approach, which combines an antenna probe element or elements to a high impedance voltage amplifier to produce an E-field sensing transduction mechanism. This approach presents advantages including broadband reception due to the lack of necessity for impedance matching between the antenna probe element(s) and the high input impedance voltage amplifier. Another advantage of this approach is that the size of the antenna probe elements are not dependent upon wavelength as passive antenna geometries are in order to accomplish resonance at the frequencies of interest.

Figure 2:
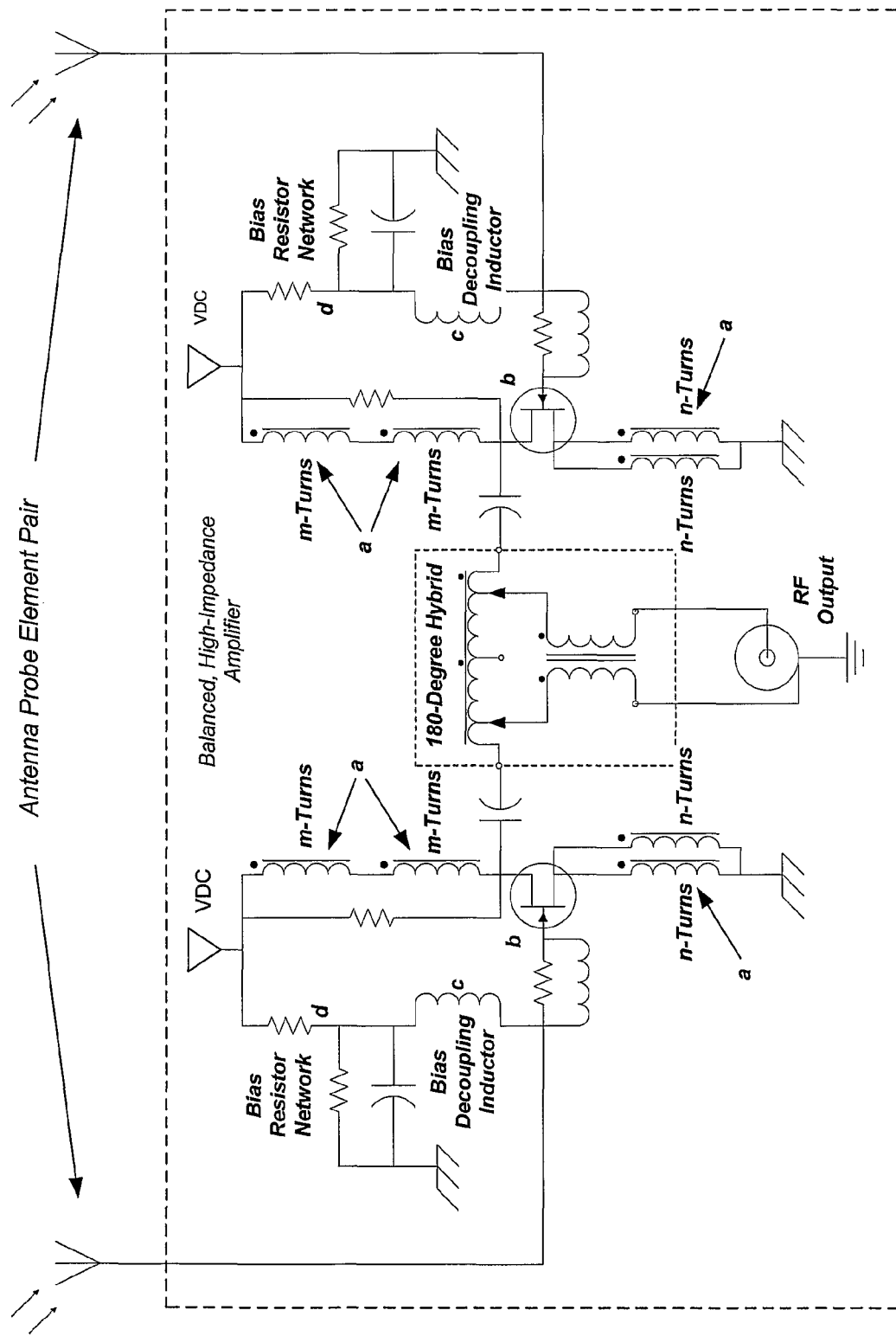
FIG. 2 depicts a high-impedance, differential voltage amplifier circuit utilizing lossless feedback to maximize input impedance and linearity in accordance with another embodiment of the invention.

FIG. 2 depicts an amplifier embodiment, utilizing a high-impedance differential voltage amplifier design. Through the implementation of passive, lossless feedback, this differential voltage amplifier accomplishes scaleable gain, improved linearity, and greater input impedance than other common voltage amplifier designs.

The lossless feedback circuit comprises a wire-wound transformer (a) connected, as depicted, to a Field Effect Transistor (FET) (b) or any other high impedance transistor. The effective gain of the voltage amplifier is determined by the turn ratio of the transformer and can be scaled accordingly. To further reduce the noise contribution of the amplifier to the antenna system, a bias decoupling inductor (c) is used to decouple the noise contribution of the bias resistor network (d) from the input of the transistor (b). In one embodiment, a broadband inductor is implemented for (c) to ensure low noise operation across the entire VHF and UHF bands.

The inductance value of (c) can be chosen such that an RF voltage peaking effect is obtained at the transistor (b) input at a desired frequency. The combination of the lossless feedback voltage amplifier design and the E-field sensor active antenna approach results in an electrically small, active antenna system with a broadband frequency response, scalable gain, very low amplifier noise contribution and wide dynamic range.

As a standalone active antenna system, the antenna probe element of FIG. 1 and the amplifier subassembly of FIG. 2 exhibit the bi-directional directive properties of a standard dipole of a fixed length. With the addition of a scatter-plate, this active antenna system becomes directive with separate, frequency-dependant, directive modes. Towards the lower half of the bandwidth of interest, the antenna system operates in a directive, capacitively-coupled loop mode, in which the fringing electric fields at the ends of the antenna probe elements, capacitively couple to the scatter-plate creating a directive loop effect. Towards the upper half of the bandwidth of interest, the wavelength is small enough relative to the design geometry, such that the antenna system operates in a reflector mode.

The scatter-plate can be tuned such that these separate directive modes occur at convenient areas of the RF frequency spectrum. The tuning mechanisms are: 1) distancing of the scatter-plate from the driven elements and 2) the effective inductance of the scatter-plate. The scatter-plate's effective inductance can be affected by material properties and geometry. Other means of achieving directivity using the antenna probe element and amplifier subassembly include: combining multiple subassemblies into arrays (fixed or steerable); combining a driven subassembly with a non-driven director element; and combining a driven subassembly with any number of non-driven director elements and a scatter-plate/reflector assembly.

In the case of an active antenna system designed for broadband TV reception, such as the embodiment illustrated in FIG. 1, the scatter-plate (s) dimensions and proximity to the antenna subassembly (a) & (b) are chosen such that the antenna exhibits a minimum front to back directive ratio (F/B) of +8 dB at High VHF and UHF frequencies. In this case, the overall length of the antenna probe element and amplifier subassembly is 22" and the 4.5" by 27" scatter-plate is located 3" from the center line of the antenna subassembly. It is possible to achieve similar directive properties at lower frequencies, such as Low VHF TV and FM radio channels, if the scatter-plate geometry is tuned appropriately for those frequencies.

Unless the context clearly requires otherwise, throughout this application, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof.

Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the invention provided herein can be applied to other systems, not necessarily the system described above. The elements and acts of the various embodiments described above can be combined to provide further embodiments.

Changes can be made to the invention in light of the above Detailed Description. While the above description details certain embodiments of the invention and describes the best mode contemplated, no matter how detailed the above appears in text, the invention can be practiced in many ways. Details of the antenna system may vary considerably in its implementation details, while still being encompassed by the invention disclosed herein.

Those skilled in the relevant art will appreciate that aspects of the invention can be practiced with other communications including: Internet appliances, hand-held devices (including personal digital assistants (PDAs)), wearable computers, all manner of cellular or mobile phones, multi-processor systems, microprocessor-based or programmable consumer electronics, set-top boxes, network PCs, mini-computers, mainframe computers, and the like. Indeed, the terms "computer," "host," and "host computer" are generally used interchangeably herein, and refer to any of the above devices and systems, as well as any data processor.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:
1. An active antenna system, the system comprising:
    a differential voltage amplifier subassembly utilizing a passive lossless feedback circuit;
    a subassembly having a pair of dipole probe elements connected to the differential voltage amplifier for producing an electric field sensing transduction mechanism for the reception of signals;

a scatter-plate subassembly that is tuned to direct received signals onto the pair of dipole probe elements subassembly;
a bias decoupling inductor to reduce noise contribution of the differential voltage amplifier;
wherein an inductance value of the decoupling inductor is selected such that an RF voltage peaking effect is obtained at a transistor input at a desired frequency.

2. The system of claim 1, wherein the passive lossless feedback circuit comprises a transformer connected to a Field Effect Transistor (FET) or a high impedance transistor, and wherein a gain of the differential voltage amplifier is scaled by turn-ratio of the transformer.

3. The system of claim 1, wherein directivity is achieved by combining multiple subassemblies into fixed or steerable arrays; by combining a driven subassembly with a non-driven director element; or by combining a driven subassembly with any number of non-driven director elements and a scatter-plate/reflector assembly, or by a combination thereof.

4. The system of claim 1, wherein in a lower half of a bandwidth of interest, the system is operational in a directive, capacitively-coupled loop mode in which fringing electric fields at ends of the pair of dipole probe elements capacitively couple to the scatter-plate and create a directive loop effect and in a upper half of the bandwidth of interest the system is operational in a reflector mode, and wherein the scatter-plate is tuned such that these separate directive modes occur at convenient areas of the RF frequency spectrum.

5. An antenna comprising:
a differential voltage amplifier subassembly utilizing passive lossless feedback;
a subassembly having a pair of dipole elements connected to the differential voltage amplifier for producing an electric field sensing transduction mechanism;
a scatter-plate subassembly,
wherein the scatter-plate subassembly is tuned such that separate directive modes occur at desired areas of the RF frequency spectrum;
a bias decoupling inductor to reduce noise of the differential voltage amplifier;
wherein an inductance value of the decoupling inductor is selected such that an RF voltage peaking effect is obtained at a transistor input at a desired frequency.

6. An antenna comprising:
a differential voltage amplifier subassembly utilizing passive lossless feedback;
a subassembly having a pair of dipole elements connected to the differential voltage amplifier for producing an electric field sensing transduction mechanism; and
a scatter-plate subassembly, wherein for broadband TV reception, the scatter-plate dimensions and proximity to the differential voltage amplifier and dipole elements are chosen such that the antenna exhibits a minimum front to back directive ratio (FIB) of about +8dB at High VHF and UHF frequencies;
a bias decoupling inductor to reduce noise contribution of the differential voltage amplifier;
wherein an inductance value of the decoupling inductor is selected such that an RF voltage peaking effect is obtained at a transistor input at a desired frequency.

7. An antenna system for broadband directive reception, the antenna system, comprising:
a differential voltage amplifier subassembly with lossless feedback;
a dipole probe subassembly connected to the differential voltage amplifier for producing an electric field sensing transduction mechanism for the reception of signals;
a scatter-plate subassembly that is tuned to direct received signals onto the dipole probe subassembly;
the lossless feedback is provided by using a wire-wound transformer connected to a high impedance transistor;
the differential voltage amplifier gain is scaled by turn-ratio of the wire-wound transformer;
a bias decoupling inductor is used to reduce noise contribution of the differential voltage amplifier to the antenna system; and
an inductance value of the bias decoupling inductor is such that an RF voltage peaking effect is obtained at a transistor input at a desired frequency.

8. An antenna system comprising:
at least a differential voltage amplifier subassembly with passive lossless feedback;
a dipole probe subassembly connected to the differential voltage amplifier for producing an electric field sensing transduction mechanism;
a scatter-plate subassembly, wherein the scatter-plate subassembly is tuned by controlling effective inductance of the scatter-plates;
a bias decoupling inductor to reduce noise of the differential voltage amplifier:
wherein an inductance value of the decoupling inductor is selected such that an RF voltage peaking effect is obtained at a transistor input at a desired frequency.

9. The system of claim 8, wherein directivity is achieved by combining multiple subassemblies into fixed or steerable arrays; by combining a driven subassembly with a non-driven director element; or by combining a driven subassembly with one or more non-driven director elements and a scatter-plate subassembly, or by a combination thereof.

10. The system of claim 8, the antenna configured to operate in a directive, capacitively-coupled loop mode in which fringing electric fields at ends of the antenna probe elements capacitively couple to the scatter-plate subassembly and create a directive loop effect and towards upper half of the bandwidth of interest the antenna operates in a reflector mode, and wherein the scatter-plate is tuned such that these separate directive modes occur at convenient areas of the RF frequency spectrum.

11. An active antenna system the system comprising:
means for amplifying received signals;
wherein the amplifying means is substantially linear, balanced, and high-impedance;
means for probing radio frequency signals,
wherein the probing means is connected to the amplifying means for the reception of radio frequency signals;
means for creating directivity with separate frequency-dependant, directive modes, the means for creating directivity is configured to direct the received radio frequency signals onto the means for probing radio frequency signals;
a decoupling inductor to reduce noise contribution of the amplifying means to the antenna, and wherein inductance value of the decoupling inductor is such that an RF voltage peaking effect is obtained at a transistor input at a desired frequency.

12. The system of claim 11, wherein the amplifying means comprises a differential voltage amplifier with lossless feedback, wherein the lossless feedback is provided via a transformer connected to a high impedance transistor, and wherein gain of the differential voltage amplifier is scaled by turn-ration of the transformer.

13. The system of claim 11, wherein the probing means is connected to the amplifying means to produce an electric field sensing transduction mechanism.

14. An antenna comprising:
means for probing radio frequency signals,
means for amplifying signals received by the probing means,
wherein the amplifying means is substantially linear, balanced, and high-impedance;
means for creating directivity with separate frequency-dependant, directive modes,
wherein the means for creating directivity is tuned such that separate directive modes occur at desired areas of the RF frequency spectrum;
means for noise reduction of the amplifying means;
wherein an inductance value of the means for noise reduction is selected such that an RF voltage peaking effect is obtained at a transistor input at a desired frequency.

15. An antenna for reception of signals, the antenna, comprising:
a substantially linear, balanced, high-impedance, differential voltage amplifier utilizing a lossless feedback circuit;
at least two dipole probe elements connected to the amplifier, wherein the combination of the amplifier and the dipole probe elements produce an electric field sensing transduction mechanism for the reception of signals, and wherein the antenna operates with a bi-directive reception pattern; and
a scatter-plate subassembly that is tuned to direct received signals onto said at least two dipole probe elements;
wherein, a bias decoupling inductor is used to reduce noise contribution of the amplifier to the antenna, and wherein an inductance value of the bias decoupling inductor is selected such that an RF voltage peaking effect is obtained at a transistor input at a desired frequency.

16. The active antenna of claim 15, wherein the scatter-plate is further configured to operate with a directive reception pattern over multiple octaves of Radio Frequency (RF) spectrum with separate frequency-dependant directive modes, and wherein the scatter-plate is tuned such that the separate directive modes occur at select areas of the RF frequency spectrum.

17. The active antenna of claim 15, wherein the lossless feedback circuit comprises a wire-wound transformer connected to a Field Effect Transistor (FET) or a high impedance transistor, and wherein gain of the differential voltage amplifier is scaled by turn-ratio of the wire-wound transformer.

* * * * *

UNITED STATES PATENT AND TRADEMARK OFFICE
CERTIFICATE OF CORRECTION

| | | |
|---|---|---|
| PATENT NO. | : 7,936,311 B2 | Page 1 of 1 |
| APPLICATION NO. | : 10/590604 | |
| DATED | : May 3, 2011 | |
| INVENTOR(S) | : Rowser et al. | |

It is certified that error appears in the above-identified patent and that said Letters Patent is hereby corrected as shown below:

Column 6, line 22, in Claim 8, delete "scatter-plates;" and insert -- scatter-plate; --.

Column 6, line 24, in Claim 8, delete "amplifier:" and insert -- amplifier; --.

Column 6, line 44, in Claim 11, delete "active antenna system" and insert -- active antenna system, --.

Column 6, lines 66-67, in Claim 12, delete "turn-ration" and insert -- turn-ratio --.

Column 8, line 12, in Claim 16, delete "active antenna" and insert -- antenna --.

Column 8, line 19, in Claim 17, delete "active antenna" and insert -- antenna --.

Signed and Sealed this
Twenty-fifth Day of September, 2012

David J. Kappos
*Director of the United States Patent and Trademark Office*